United States Patent [19]

Sinha

[11] Patent Number: 5,300,483
[45] Date of Patent: Apr. 5, 1994

[54] PROCESS FOR PREPARING SHAPED SUPERCONDUCTOR MATERIALS VIA NONEQUILIBRIUM PRECURSORS

[76] Inventor: Shome N. Sinha, 220 N. Lombard Ave., Oak Park, Ill. 60302

[21] Appl. No.: 821,692

[22] Filed: Jan. 16, 1992

[51] Int. Cl.$^5$ .................. C01F 11/02; C01F 17/00; C01G 3/02; H01L 39/24
[52] U.S. Cl. .................. 505/510; 505/725; 505/736; 505/737; 505/780; 505/480; 505/490
[58] Field of Search ............ 505/1, 736, 733, 737, 505/780, 729, 725; 423/DIG. 15

[56] References Cited

U.S. PATENT DOCUMENTS

| | | | |
|---|---|---|---|
| 4,784,686 | 11/1988 | Meek | 252/521 |
| 4,826,808 | 5/1989 | Yurek et al. | 505/1 |
| 4,861,753 | 8/1989 | McCarron, III | 505/1 |
| 4,904,638 | 8/1990 | DiCarolis | 505/1 |
| 4,956,340 | 9/1990 | Kimura et al. | 505/1 |
| 4,962,085 | 10/1990 | De Barbadillo, II et al. | 505/1 |
| 4,977,109 | 12/1990 | Liu | 505/1 |
| 4,992,415 | 2/1991 | Ashok | 505/736 |
| 5,032,570 | 7/1991 | Ogata et al. | 505/1 |
| 5,034,373 | 7/1991 | Smith | 505/1 |
| 5,077,268 | 12/1991 | Clark | 505/780 |

FOREIGN PATENT DOCUMENTS

63-256519 2/1989 Japan .

OTHER PUBLICATIONS

Blendell, "Relationship of Electrical, Magnetic, and Mechanical Properties...", *Chemistry of High-Temperature Superconductors*, Amer. Chem. Soc. 1987, pp. 240-260.
Bordia, "Sintering and Microstructure-Property Relations for YBa$_2$CuO$_7$", *Mat. Res. Soc. Symp. Proc.*, v. 99, 1988, pp. 245-248.
Zhenhong, "The micro-region compositional variation of YBa$_2$Cu$_3$O$_{9-x}$", *Int'l. Jnl. Modern Phys. B* v. 1(2), 1987, pp. 231-236.
Liquan, "Some factors effect on zero-resistance temperature...", *Int'l. Jnl. Modern Phys. B*, vol. 1(2), 1987, pp. 267-272.
Science-vol. 241 (1988) pp. 922-941-Murphy et al.--Processing Techniques for the 93K Superconductor Ba$_2$Y Cu$_3$O$_7$.
Jour. Appl. Phys. vol. 63 (1988) pp. 2725-2729-Barboux et al.-Bulk and Thick Films of Superconducting Phase YBA$_2$CU$_3$O$_7$Y etc.
Advanced Ceramic Materials-vol. 2 (1987) pp. 337-342-Johnson et al.-Preparation of Superconducting Powders by Freeze-Drying.
Jpn. J. Appl. Phys., vol. 29 (1990) pp. 2711-2714-Kim et al.-The Reaction Sequence in the System Y$_2$Ba Cu O$_5$—Ba Cu-CuO etc.
Jpn. J. Appl. Phys., vol. 27 (1990) pp. L1501-L1503-Tachi Kawa et al.-Fabrication of Superconducting Y—Ba—Cu Oxide, etc.
Science, vol. 142-Dec. 1988, pp. 1519-1527-Sleight--Chemistry of High-Temperature Superconductors.

*Primary Examiner*—Paul Lieberman
*Assistant Examiner*—John Boyd
*Attorney, Agent, or Firm*—Dressler, Goldsmith, Shore & Milnamow, Ltd.

[57] ABSTRACT

A method is provided for preparing a precursor of a superconductor containing atoms of oxygen, atoms of copper and atoms of at least two other metals and sufficient atoms of oxygen so that up to, but no more than, one atom of copper is in the trivalent state, in which method there are blended together, in finely divided particulate state, components containing atoms of the metals in the desired proportion with at least one of the components containing oxygen in an amount above that which would put more than one atom of copper into the trivalent state and thereafter milling the components together in a high energy system to a maximum particle size of about 5 microns for at least 99 weight percent of the blend.

31 Claims, No Drawings

PROCESS FOR PREPARING SHAPED SUPERCONDUCTOR MATERIALS VIA NONEQUILIBRIUM PRECURSORS

FIELD OF THE INVENTION

This invention relates to a process for making superconductive materials into desired shapes or to the fabrication of shaped articles having high temperature superconducting properties as well as physical toughness. In one aspect, the invention also relates to the preparation of a nonequilibrium precursor which can be fabricated into shaped articles having high temperature superconducting properties and to the composition of this precursor.

BACKGROUND OF THE INVENTION

Prior to the middle of the last decade, superconductivity was restricted to such extremely low temperatures that it remained, primarily, a scientific curiosity with little practical value. The discovery of superconductivity in copper oxide-based ternary and quaternary systems at relatively high temperatures has generated extreme interest in the prospect that superconductors might, at last, find a niche in commercial technology. There are, however, practical difficulties.

One of the most promising systems for high temperature superconductors is based on the formula $REBa_2Cu_3O_{7-x}$, where RE is a rare earth metal having an atomic number from 57 to 71, preferably yttrium, and x is a small number, less than 1. Murphy et al., Science, vol. 241 (1988) pp. 922-941, have provided an excellent review of the available processing techniques for the manufacture of $YBa_2Cu_3O_{7-x}$ high temperature superconductors. The Murphy et al. review indicates a number of difficulties in the processing techniques, including i) difficulties in achieving chemical homogeneity, ii) extreme brittleness and poor formability of the end and intermediate products, iii) "weak link" behavior arising from the tunneling of superconducting currents between isolated regions of superconductivity separated by thin non-superconductivity barriers, iv) the necessity for final oxygenation of the end product at 400°-500° C. and v) the presence of residual carbon.

For the synthesis of bulk $YBa_2Cu_3O_{7-x}$ superconductors, a broad spectrum of other processing techniques have been used, including (a) sol-gel processing (U.S. Pat. No. 4,977,109 of Liu and Barboux et al. Journal of Applied Physics, vol. 63, 1988, pp. 2725-29) (b) co-precipitation (U.S. Pat. Nos. 4,956,340 and 4,904,638 of Dicarolis and Barboux et al.supra, (c) use of nitrate or halide precursors (U.S. Pat. No. 4,861,753 of McCarron III and Japanese Patent 63256519), and (d) freeze drying (S. M. Johnson et al., Advanced Ceramic Materials, vol. 2, 1987,(pp 337-42).

Other processes, based on processing of appropriate intermediate precursors and aimed at avoiding submicron inhomogeneities include (i) chemical oxidation of liquid or solid metallic alloys for $EuBa_2Cu_3O_7$ superconductors (U.S. Pat. No. 4,826,808 of Yurek et al.) (ii) oxidation of mechanically alloyed $YBa_2Cu_3O_7$ powders (U.S. Pat. No. 4,962,085 of De Barbadillo II et al.) (iii) reaction of $Y_2Cu_2O_5$ and $BaCuO_2$ (U.S. Pat. No. 5,032,570 of Ogata et al.) (iv) reaction of $Y_2BaCuO_2$, $BaCuO_2$ and $CuO$ (H. D. Kim et al., Jpn. J. Appl. Phys., vol. 29 (1990) pp. 2711-14), (v) reaction of $Y_2Cu_2O_5$ and $Ba_3Cu_5O_5$ (Tachikawa et al., Jpn. J. Appl. Phys., vol. 27, 1990, pp. L1501-1503), reaction of $Y_2O_3$, $BaO_2$ and $CuO$ (U.S. Pat. No. 5,036,043 of Subramanian).

An objective of the present invention is to provide an effective and simplified process for making high temperature superconductors of the copper oxide family whereby there is significant improvement over the prior art in (i) chemical homogeneity achieved at better than micron level, (ii) impact brittleness problems at various processing stages are eliminated or minimized, (iii) carbon content of the superconductor is less than 0.10 weight percent, (iv) net shape processing can be achieved and (v) oxygenation of the end product is generally eliminated.

Sleight, Science, vol. 242 (1988), pp. 1519-1527, discloses that $YBa_2Cu_3O_7$ is not stable at any condition of pressure and temperature; and that therefore "the synthesis of $YBa_2Cu_3O_7$ requires two steps: first, $YBa_2Cu_3O_{6+x}$ is formed where x is approximately 0.5-0.8; and second, oxidation to $YBa_2Cu_3O_7$ is carried out at a lower temperature."

In accordance with the invention described below $YBa_2Cu_3O_7$ be synthesized in a single sintering step from a precursor; and there is no necessity for a separate post-sintering oxidation step, as indicated in the Sleight article.

Sleight, reveals with respect to Y-Ba-Cu-O systems that $Y_1Ba_2Cu_3O_6$ is not a superconductor, but an antiferromagnetic insulator which may be indicated with respect to oxidation states as $Y^{III}Ba_2^{II}Cu_2^{I}Cu^{I}O_6$ where I is monovalent, II is divalent and III is trivalent. It contains no trivalent copper. As the oxygen content is increased above the 6-level, $Cu^{III}$ atoms appear in the system along with superconductivity at higher temperatures until an oxygen level of close to 7 is obtained. Above this level, or above $YBa_2Cu_3O_7$, additional oxygen results in the production of non-superconducting phase(s). In other words, superconductivity in such systems appears to require that some of the copper in the system be in the trivalent state, but not more than one of the three copper atoms in the formula can be trivalent if high temperature superconductivity is to be maintained.

SUMMARY OF THE INVENTION

In accordance with one aspect of the invention there is provided a process for preparing a precursor of a superconductor containing atoms of oxygen, atoms of copper and atoms of at least two other metals and containing sufficient atoms of oxygen so that up to, but not more than, one atom of copper is in the trivalent state which comprises blending together, in finely divided particulate state, components containing atoms of the desired metals in the desired proportion, at least one of said components containing oxygen, with the total level of oxygen being above that which would put more than one atom of copper into the trivalent state and thereafter milling said components together in a high energy system to a maximum particle size of about 5 microns for at least 99 weight percent of said blend.

In accordance with another aspect of the invention a shaped article of a superconductor is prepared from the above described nonequilibrium precursor by forming it into a desired shape and thereafter heating the formed shape rapidly to an elevated temperature between about 850° and about 1150° C. and maintaining it within said elevated temperature range for a period between about 0.1 and about 30 hours.

The fact that the above described precursor is a nonequilibrium precursor is an important factor in this invention. At equilibrium, a reversible condition exists; and it is possible that some of the desired composite material may revert back to the original starting materials, producing inhomogeneity.

The precursor in accordance with this invention is in a nonequilibrium state both by reason of its stoichiometry (an excess of oxygen over that required by the formula of the desired superconductors) and by reason of the very small sizes and extremely high residual strains induced by milling in the particles providing an additional entropy factor making the product highly reactive.

Nevertheless, the precursor in accordance with this invention is stable in its nonequilibrium state to the extent that it may be stored (in contact with an inert gas or with air free of moisture and carbon dioxide) for periods of a month or more without degradation.

When superconducting compositions are prepared from components containing oxygen in the amount called for by the stoichiometry of the desired composition, there is a loss of oxygen during processing. Typically, according to Murphy et al., the composition of a theoretical $YBa_2Cu_3O_7$ will be about $YBa_2Cu_3O_{6.3}$. It therefore becomes necessary to anneal the composition in oxygen at 400° to 500° C. in order to raise the oxygen content.

In accordance with the present invention, such post-sintering annealing is unnecessary.

Although the invention is applicable to all high temperature superconductors of the copper oxide family, it is explained hereinbelow with particular reference to $YBa_2Cu_3O_{7-x}$ superconductors, where x has a value between zero and about 0.40.

Other superconducting systems in which the invention is applicable include the $YBa_2Cu_4O_{8+x'}$ and the $Y_2Ba_4Cu_7O_{14+x''}$ families of superconductors in which x' may vary between about zero and about 0.05, and x'' may vary between about zero and about 0.30.

Still other superconducting systems are in the bismuth family of high temperature superconductors. Typical of this family are superconductors represented by the formula: $(AO)_2Sr_2Ca_{n-1}Cu_3O_{n+2+z}$ where A is bismuth or a combination of bismuth and lead, the total A is between 0.8 and 1.4, n=1, 2±0.2 or 3±0.3 and z is from zero to 1.

The starting materials for blending may be free metals or metal compounds containing oxygen, such as metallic oxides or nitrates. Carbonates may be used, but are not preferred because of the necessity to remove residual carbon from the product.

To obtain the desired oxygen content in the blend, it is clear that not all of the starting materials can be free metals and that at least one of the starting materials must have an oxygen content higher than that of the oxide of the metal at its normal highest stable values (i.e., higher than the oxygen content of BaO, CuO or $Y_2O_3$).

To prepare superconductors of the formula $YBa_2Cu_3O_{7-x}$ typical starting formulations may be:

(1) metallic yttrium, metallic copper and barium nitrate in a molar ratio of 1:3:2, (2) metallic yttrium, cupric oxide and barium nitrate in a molar ratio of 1:3:2.

(3) yttrium nitrate, cupric oxide and metallic barium in a molar ratio of 1:3:2.

(4) yttrium oxide, metallic copper and barium nitrate in a molar ratio of 1:3:2.

(5) metallic yttrium, cupric nitrate and barium nitrate in a molar ratio of 1:3:2.

The yttrium may be replaced in whole or in part, by other rare earth metals having an atomic number between 57 and 71.

Other metals which are not rare earth metals may replace a portion of the yttrium, or other rare earth metal. Silver has been found to be a useful metal in this context.

The formula for a composition containing such another metal may be written as $M'_{1-y}Y_yBa_2Cu_3O_{7-x}$ where M' is any transition metal, y is less than one and x has a value between zero and 0.40.

In the starting blend the oxygen level of the blended constituents must be more than sufficient to satisfy the formula $Y_1Ba_2Cu_3O_8$.

Aside from replacing a portion of the yttrium, other additives, or dopants, may be added which remain as a separate solid discontinuous phase in the final superconducting structure. Such materials are either metals or metal oxides or combinations thereof which are known to be not harmful to superconductivity and, in some cases, beneficial thereto. The amount of such dopant(s) is limited to about 90 percent of the combined weight of yttrium, barium and copper in order to assure that the dopant does not become the continuous phase of the system.

Some dopants improve the mechanical properties of the system. Others improve the critical current density. Metallic silver is the preferred dopant and performs both functions.

Other useful dopants include fluorine, chlorine, zinc, iron and zirconium oxide, the first two being added as gases within the mill during the milling operation.

The starting components are finely divided and of high purity. The milling is conducted under dry conditions in a high energy mill which may be an attrition mill, a roller mill or a ball mill. The Szegvari Attritor, made by Union Process of Akron, Ohio, is a suitable high energy mill. Optimum results require care in the selection of the materials of construction of milling tanks, balls, shafts and arms, the volume of the milling tank relative to the volume of the balls and the powder being worked on, the weight ratio of balls to powder, milling speed and milling time. Optimum milling conditions in a ball mill requires selection of balls of the highest possible density and minimum size. The selected material of construction for the grinding balls should have the highest possible resistance to abrasion. High density, yttria-stabilized zirconium dioxide has been found to be quite satisfactory for this purpose. The optimum ball/powder weight ratio is from about 5 to about 20.

The milling requires high energy, or high power per unit time. Preferably, the blend should be milled at at least 200 watt-hours per gram and the milling should proceed until the particle size, as revealed in a scanning electronic microscope is smaller than 5 microns for more than 99 weight percent of the product, preferably smaller than one micron for more than 99 weight percent of the product and most preferably smaller than 0.5 microns for more than 99 weight percent of the product.

To achieve these results, the time necessary depends on the chemical nature and the fineness of the starting materials, the degree of fineness desired in the product, the energy input, and the milling efficiency. Generally, adequate milling will require at least about 8 hours.

To assist in the milling, it is desirable to add to the starting blend, or during blending, a small amount of a volatile organic liquid, such as up to one ml of methanol or absolute ethanol per 100 grams of blend.

After completion of the milling process, the milled product is optionally heated in an inert gaseous atmosphere at ambient pressure and a temperature less than 600° C. Care should be taken to avoid overheating which may coarsen the particles by agglomeration and reverse some of the effect of the high energy milling.

It has been found that, when the starting materials are metallic yttrium, metallic copper and barium nitrate, these materials are converted during the post-milling heating process to $BaCuO_{2.5}$, $Y_2O_3$ and CuO. The formation of $BaCuO_{2.5}$ from a mixture of $Ba(NO_3)_2$ has been reported by Machida et al., Journal of Solid State Chemistry, vol. 91 (1991), pp. 176–179. Prior to this invention, $BaCuO_{2.5}$ has not been known as a constituent of a precursor for a superconductor.

The total reaction sequence for the formation of the superconductor may be represented by the following two overall chemical reactions:

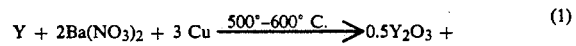

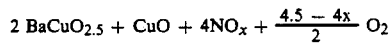

where x is more than one, but less than 1.125.

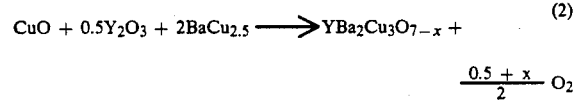

The first of these reactions takes place during the post-milling heating step in the formation of the nonequilibrium precursor; and the second takes place after the precursor is formed into its desired shape and subjected to a higher enough temperature to produce the shaped superconductor.

After the milling step and the optional heating step, the nonequilibrium precursor is stable in storage for at least a month, provided that it is kept from moisture and from carbon dioxide. Forming the precursor to a superconductor in its desired shape may therefore be delayed, if desired, or may be performed at another site.

To produce a high temperature superconductor of desired shape from the Ba Cu $O_{2.5}$-containing precursor material, the material is first formed into the desired shape without a binder and is then subjected to rapid heating to a temperature above about 850° C. for a period sufficient to fuse the constituents into a coherent solid and to convert the precursor constituents to a material of the high temperature superconducting material.

The heating is preferably a rapid heating at a rate higher than about 1000° C. per hour; and the time of heating is generally from about 0.5 to about 30 hours, with shorter times being associated with higher temperatures within the range.

After the conversion of the precursor to a superconducting phase by heat treatment, the superconductor is cooled in air, or in oxygen-enriched air containing 30 volume percent of oxygen. The rate of cooling is preferably less than about 60° C. per hour.

When the desired shape is thin and flat, as a film, the precursor is spread out as a thin layer on a support or substrate, and then subjected to rapid heating to consolidate the precursor particles and achieve the desired chemical conversion.

There are many suitable substrates. Typical substrates include silver foil, magnesium oxide (MgO), strontium titanate ($SrTiO_3$), alumina ($Al_2O_3$), silicon (Si), yttria-stabilized zirconia ($ZrO_2$-$Y_2O_3$), spinel ($MgO \cdot Al_2O_3$), lanthanum gallate ($LaGaO_3$), and lanthanum aluminate ($LaAlO_3$).

When the desired shape is a three dimensional shape, such as an elongated cylindrical tube of pencil thickness, the precursor is compressed, or compacted, within a mold without a binder and heated rapidly to a temperature above about 850° C. to obtain a coherent solid product.

In a preferred embodiment, the cylindrical mold is made of solid silver and subjected, with its compacted precursor contents to a series of cold rolling steps or hot rolling steps to increase the compaction and to decrease its cross-sectional area.

One method of rapid heating is by exposure to an inductively coupled plasma, which may be created by microwave energy, or by radio frequency energy.

EXAMPLES 1 TO 7

PREPARATION OF MILLED PRODUCT AND SYNTHESIS OF INTERMEDIATE PRECURSOR

In each of Examples 1 to 7 the aim was to obtain a highly homogeneous milled powder consisting of particles finer than 1 micrometer.

The starting materials were high purity chemicals of 99.9% purity or better, preground, if needed, to 200–300 mesh, weighed and premixed with a few drops (0–1 ml per 100 gm of powder) of ethyl alcohol in a roller mixer. The chemicals were stored in argon filled desiccators; and special care was taken during handling to minimize moisture and carbon dioxide contaminations.

The premixed chemicals 8.5 grams of yttrium powder, 50 grams of barium nitrate and 18.23 grams of copper powder) were milled in a model 01-HD Szegvari Attritor, Union Process, equipped with a 750 ml 15% silica-alumina tank and stainless steel agitator arms, and 5 mm diameter yttria-stabilized zirconia balls. During milling, high purity argon gas was continuously passed through the milling tanks to maintain an inert environment during the milling process. The milling tank was cooled by passing cooling water through its external heating tank.

After milling the powders were easily separated from the balls and heat treated at temperatures varying from 500° C. to 725° C., as shown in Table I.

Table I also shows the milling parameters, including milling speed, ball/powder ratio and milling time.

TABLE I

| Example No. | Milling Stage | Milling Speed rpm | Ball/ Powder ratio wt:wt | Milling time hrs. | Maximum Temperature °C. |
|---|---|---|---|---|---|
| 1 | I | 150 | 5:1 | 4.0 | |
| | II | 150 | 10:1 | 6.5 | 725 |
| 2 | I | 150 | 9:1 | 10 | 600 |
| 3 | I | 170 | 3:1 | 4.5 | |
| | II | 170 | 10:1 | 6.5 | 500 |
| 4* | II | 150 | 10:1 | 14 | 500 |
| 5* | II | 150 | 10:1 | 20 | 600 |
| 6 | I | 150 | 10:1 | 1 | 600 |

TABLE I-continued

| Example No. | Milling Stage | Milling Speed rpm | Ball/Powder ratio wt:wt | Milling time hrs. | Maximum Temperature °C. |
|---|---|---|---|---|---|
| 7 | I | 150 | 10:1 | 15 | 600 |

*The starting powders in Examples 4 and 5 were from stage I of Example 3.

EXAMPLES 8 To 15

Synthesis of Intermediate Precursors

Milled products prepared in the general manner of Examples 1 to 7 were heat treated to remove volatile materials originating from the decomposition of the nitrates in the starting materials. Pure barium nitrate decomposes at its melting point (600° C.) following a two stage mechanism as follows:

$$Ba(NO_3)_2 \rightarrow Ba(NO_2)_2 + O_2 \quad (3)$$
$$Ba(NO_2)_2 \rightarrow BaO + NO + NO_2 \quad (4)$$

However, in the presence of metallic yttrium and copper, the decomposition is different and is represented by equation (1), hereinabove.

The reaction of equation (1) proceeds to completion when the post-milling heat treatment of the precursor is maintained for a sufficient period (e.g., 5–24 hours) at about 600° C. in a dynamic argon environment.

EXAMPLES 8 TO 15

For the preparation of bulk (three dimensional) $YBa_2Cu_3O_{7-x}$ superconductors, selected precursor materials from Examples 1 to 7 were packed in silver tubes measuring 6 cm in length and 0.64 cm in diameter; and the packed silver tubes were cold rolled, or hot rolled (at a temperature of about 900° C.)

The packing was done in stages with compaction by vibration between each stage. After packing and rolling, the tubes were subjected to heat treatment in the presence of air, or oxygen, at temperatures of about 900° C, for periods between about 15 and 20 hours. For comparison purposes, the heating times in two of the examples (14 and 15) were much shorter; and the preparation of a high temperature superconductor was not achieved in those examples.

The temperature of onset of superconductivity ($T_c$) and the current density ($J_c$) at 77° K were measured for each fused product.

The results are shown in Table II.

The data indicate that hot rolling is preferable to cold rolling with respect to the levels of current density achievable, probably by reason of better densification of the powdered materials and better connectivity of the grains in dense superconductors.

The invention has been described in it preferred embodiments. It will be understood by those skilled in the art that modifications and variations may be made without departing from the essence of the invention.

I claim:

1. The process for preparing a precursor of a superconductor containing atoms of oxygen, atoms of copper and atoms of at least two other metals and sufficient atoms of oxygen so that up to, but not more than, one atom of copper is in the trivalent state which comprises blending together, in finely divided particulate state, components containing atoms of the desired metals in the desired proportion, at least one, but not all, of said components being a compound containing oxygen with the total level of oxygen being above that which would put more than one atom of copper into the trivalent state and thereafter milling said components together in a high energy system to a maximum particle size of about 5 microns for at least 99 weight percent of said blend.

2. The process of claim 1 wherein said superconductor contains atoms of barium and of a rare earth metal having an atomic number from 57 to 71.

3. The process of claim 2 wherein said milling step is followed by a heat treatment step in the absence of oxygen at a temperature between about 450° and 600° C. for a period between about 0.5 and 30 hours.

4. The process of claim 3 wherein said superconductor contains yttrium.

5. The process of claim 4 wherein said superconductor is of the formula $Y_1Ba_2Cu_3O_{7-x}$ where x has a value between zero and about 0.40 and the oxygen level of the blended components is more than sufficient to satisfy the formula $Y_1Ba_2Cu_3O_8$.

6. The process of claim 4 wherein said superconductor is of the formula $M'_{1-y}Y_yBa_2Cu_3O_{7-x}$ where $M'$ is a transition metal, y is less than one and x has a value between zero and 0.40 and the oxygen level of the blended components is more than sufficient to satisfy the formula $M'_{1-y}Y_yBa_2Cu_3O_8$.

7. The process of claim 6 wherein said superconductor also contains, as a dopant, a finely divided metal or metal compound in an amount up to 90 weight percent of the combined content of $M'$, yttrium, barium and

TABLE II

| Example No. | Precursor From Example | Reduction in Rolling Cold % | Reduction in Rolling Hot % | Heat Treatment Temp. °C. | Heat Treatment Time Hours | Heat Treatment Environment | $T_c$ onset °K. | $J_c$ 77° K. Amp/cm² |
|---|---|---|---|---|---|---|---|---|
| 8 | 7 | — | 53 | 900 | 18 | Air | 92 | 175 |
| 9 | 7 | 53 | — | 900 | 18 | Air | 92 | 92 |
| 10 | 5 | 35 | 18 | 900 | 15 | Air | 91 | 73 |
|   |   |   |   | 450ᵃ | 16 | Air |   |   |
| 11 | 10 | — | — | 850ᵇ | 20 | Oxygen | 91 | 86 |
| 12 | 7 | 53 | — | 900 | 18 | Oxygen | ᶜ | ᶜ |
| 13 | 5 | 42 | — | 850 | 15 | Oxygen |   |   |
|   |   |   |   | 450ᵃ | 16 | Oxygen | ᶜ | ᶜ |
| 14 | 7 | 37 | 40 | 900 | 0ᵈ | Air |   |   |
| 15 | 7 | 37 | 40 | 900 | 4 | Oxygen |   |   |

ᵃ450° C. heat treatment was done after 900° C. heat treatment
ᵇThe starting sample was from Example 10 which had already been heat treated at 900° C.
ᶜDue to microcracks in the sample, the superconducting properties were not measured
ᵈthe actual time of the 900° C. temperature was very short - about two minutes copper, said metal or metal compound being one which does not inhibit the superconductivity of the overall composition.

8. The process of claim 7 wherein both M' and said dopant are silver.

9. The process of claim 5 wherein said components are (1) metallic yttrium, (2) metallic copper and (3) $Ba(NO_3)_2$ in an approximate molar ratio of 1:3:2.

10. The process of claim 4 wherein said superconductor is of formula $Y_1Ba_2Cu_4O_{8+x'}$ where $x'$ has a value between zero and about 0.05 and the oxygen level of the combined components would be more than sufficient to satisfy the formula $Y_1Ba_2Cu_4O_9$.

11. The process of claim 4 wherein said superconductor is of the formula $Y_2Ba_4Cu_7O_{14+x''}$ where $x''$ is between about zero and 0.30 and the oxygen level of the combined components would be more than sufficient to satisfy the formula $Y_2Ba_4Cu_7O_{15}$.

12. The process of claim 1 wherein one of said other metals is bismuth.

13. The process of claim 12 wherein said superconductor is of the formula $(AO)_2Sr_2Ca_{n-1}Cu_3O_{2n+2+z}$ where A is bismuth or a combination of bismuth and lead, $n = 1$, $2 \pm 0.2$ or $3 \pm 0.3$ and z is from zero to 1.

14. The process of claim 1 wherein said milling is at a power level of at least 200 watt hours per gram of blend and is continued for at least 8 hours.

15. The process of claim 1 wherein said milling is attrition milling.

16. The process of claim 1 wherein said milling step is conducted in the presence of a small amount of a volatile organic liquid.

17. The process of claim 1 wherein said components are cooled during milling to prevent a temperature rise in excess of 100° C.

18. The process of preparing a nonequilibrium precursor of a superconductor of the formula $YBa_2Cu_3O_{7-x}$ where x has a value between zero and about 0.40 which comprises blending finely divided yttrium powder, finely divided copper powder and finely divided barium nitrate in a molar ratio of approximately 1:3:2 and milling said blend an energy level of at least about 200 watt-hours per gram of blend while purging with an inert gas and while cooling to prevent a temperature rise in excess of 100° C., until a particle size in the range of about 0.1 to about 5 microns is obtained.

19. The process of claim 18 wherein finely divided metallic silver is included among the components to be blended.

20. The process of preparing a shaped article of a superconductor as defined in claim 1 wherein a nonequilibrium precursor prepared in accordance with claim 1 is formed into a desired shape and thereafter heated a elevated temperature between about850° and about 1150° C. and maintained within said elevated temperature range for a period between 0.1 and about 30 hours.

21. The method of claim 20 wherein said heating is rapid heating at a rate of at least about 1000° C. per hour.

22. The method of claim 20 wherein said precursor is formed into a thin layer and said desired shape is a film.

23. The method of claim 20 wherein said precursor is formed and compacted within a mold.

24. The method of claim 23 wherein said precursor is molded and heated without a binder.

25. The method of claim 20 wherein said heating is by exposure to an inductively coupled plasma.

26. The method of claim 25 wherein said inductively coupled plasma is created by radio frequency energy.

27. The method of claim 25 wherein said inductively coupled plasma is created by microwave energy.

28. The method of claim 23 wherein said precursor is molded by compaction within a silver mold, and said silver mold is thereafter passed through a cold rolling mill to reduce its cross section.

29. The process of claim 23 wherein a plurality of molds in contact with each other are simultaneously heated to fuse together into a composite superconducting structure.

30. The process of claim 20 wherein said heating is in an oxygen-containing atmosphere.

31. The process of claim 30 wherein said shaped article is thereafter cooled in an oxygen-containing atmosphere.

* * * * *